United States Patent
Tong et al.

(10) Patent No.: US 11,775,704 B2
(45) Date of Patent: Oct. 3, 2023

(54) STRUCTURAL OPTIMIZATION METHOD FOR BIOMASS BOILER ECONOMIZERS

(71) Applicants: Zhejiang University, Hangzhou (CN); Xizi Clean Energy Equipment Manufacturing Co., ltd., Hangzho (CN)

(72) Inventors: Shuiguang Tong, Hangzhou (CN); Zheming Tong, Hangzhou (CN); Jianyun Zhao, Hangzhou (CN); Weixiao He, Hangzhou (CN); Haidan Wang, Hangzhou (CN); Wei Chen, Hangzhou (CN)

(73) Assignees: ZHEJIANG UNIVERSITY, Hangzhou (CN); XIZI CLEAN ENERGY EQUIPMENT MANUFACTURING CO., LTD., Hangzhou (CN)

( * ) Notice: Subject to any disclaimer, the term of this patent is extended or adjusted under 35 U.S.C. 154(b) by 0 days.

(21) Appl. No.: 18/073,990

(22) Filed: Dec. 2, 2022

(65) Prior Publication Data

US 2023/0237211 A1     Jul. 27, 2023

(30) Foreign Application Priority Data

Dec. 2, 2021   (CN) .......................... 202111458879.0

(51) Int. Cl.
*G06F 30/17*         (2020.01)
*G06F 30/27*         (2020.01)

(52) U.S. Cl.
CPC .............. *G06F 30/17* (2020.01); *G06F 30/27* (2020.01)

(58) Field of Classification Search
CPC ........... G06F 30/00; G06F 30/17; G06F 30/27
(Continued)

(56) References Cited

U.S. PATENT DOCUMENTS

2016/0018125 A1 *   1/2016   Hamstra .................. F24F 11/62
                                                              703/7

FOREIGN PATENT DOCUMENTS

CN        112906787 A  *  6/2021     .............. F22B 35/00
JP          6913197 B1  *  8/2021

OTHER PUBLICATIONS

Tang, Song-Zhen et al., "Fouling Potential Prediction and Multi-Objective Optimization of a Flue Gas Heat Exchanger Using Neural Networks and Genetic Algorithms", Feb. 8, 2020, International Journal of Heat and Mass Transfer 152, Elsevier Ltd. (Year: 2020).*

(Continued)

*Primary Examiner* — Cedric Johnson
(74) *Attorney, Agent, or Firm* — MUNCY, GEISSLER, OLDS & LOWE, P.C.

(57) ABSTRACT

The present invention discloses an optimization design method for structural parameters of biomass boiler economizers and belongs to the field of big data learning models. In the present invention, a sample database is established by utilizing historical operating big data of biomass boiler economizers, a heat exchanger residual self-attention convolution model is established based on a CNN and a self-attention mechanism, a plurality of target parameters to be optimized are quickly predicted through machine learning, and multi-target optimization of structural parameters to be optimized in the economizers can be performed in combination with an iterative optimization algorithm. Compared with traditional optimization for all variables of a biomass boiler economizer, the self-attention mechanism can automatically focus on features with high importance, to better optimize variables with high importance, making the subsequent optimization and adjustment convenient and quick, and greatly reducing the optimization cost.

9 Claims, 1 Drawing Sheet

(58) Field of Classification Search
USPC .......................................................... 703/7, 6
See application file for complete search history.

(56) References Cited

OTHER PUBLICATIONS

Tong, Shuiguang et al., "Online Ash Fouling Prediction for Boiler Heating Surfaces based on Wavelet Analysis and Support Vector Regression", Dec. 20, 2019, Energies 2020, 13, 59. (Year: 2019).*

* cited by examiner

STRUCTURAL OPTIMIZATION METHOD FOR BIOMASS BOILER ECONOMIZERS

TECHNICAL FIELD

The present invention belongs to the field of big data learning models, and particularly relates to a method for parameter optimization of a biomass boiler economizer structure.

BACKGROUND TECHNOLOGY

Biomass boilers have developed rapidly in recent years in the field of boilers because of the characteristics of low operating cost, high thermal efficiency and renewability. Economizer is a necessary component of the biomass boiler, which can recycle waste heat and save energy. However, the traditional economizer often has performance defects, in particular, high concentration flue gas generated in the combustion process of biomass contains high corrosive chemical components, resulting in ash deposition, slagging and even corrosion of the economizer, which greatly reduces the heat transfer efficiency. Therefore, there is a urgent need to improve the economizer in the biomass boiler. Some specific heat exchangers, such as pillow plate heat exchangers which can be applied to the waste heat recovery process of the biomass boiler, have the characteristics of good heat exchange performance, high pressure bearing capacity and larger heat exchange area per unit volume. However, a high-performance heat exchanger like pillow plate heat exchangers is difficult to effectively optimize because of small operating data sample, complex and changeable structure and difficult modeling and optimization design. How to propose an efficient and low-cost optimization method for a novel heat exchanger is the focus and difficulty at present.

Conventional heat exchanger optimization design is usually based on a design manual, and good results are sought through repeated tests. However, in some specific heat exchangers, such as pillow plate heat exchangers, a heat exchange unit contains multiple complex surfaces, there is no corresponding design manual and optimization method, and the design modeling and manufacturing process are complex, the cost of determining the optimization parameters through a test method is high, so the conventional method is not applicable.

To sum up, the existing intelligent heat exchanger optimization method applied to the biomass boiler has the defects that the design accuracy can difficultly meet the requirements; it is difficult to effectively extract a complex dependence relationship among parameters; and for some specific heat exchangers, operating data samples are small and the optimization cost is high. Based on this, it is necessary to propose a structural parameter optimization method for a biomass boiler economizer to meet the performance improvement requirements in the aspects of heat exchange efficiency and economy.

SUMMARY

An object of the present invention is to overcome the defects that a parameter optimization process of a biomass boiler economizer in the prior technology is complex and high-cost, another purpose of this invention is to provide an optimization design method for structural parameters of biomass boiler economizers.

A specific technical solution adopted by the present invention is as follows:

An optimization design method for structural parameters of biomass boiler economizers, including:

S1, obtaining historical data of different heat exchangers in different biomass boiler units operating under different working conditions, and establishing a sample database; each sample in the sample database corresponding to one heat exchanger, an input of each sample being a structural parameter of the corresponding heat exchanger, working condition operating data of the corresponding heat exchanger under a load, and operating data of the corresponding biomass boiler unit where the corresponding heat exchanger is located, and a sample label being values of a plurality of target parameters to be optimized;

S2, with the sample database as training data, training a heat exchanger residual self-attention convolution model by minimizing a weighted loss of all target parameters to be optimized, so as to obtain a heat exchanger target parameter prediction model; the heat exchanger residual self-attention convolution model including a convolutional neural network and a residual attention network, a vector being input to the convolutional neural network, and a dimensionality-reduced feature vector being obtained sequentially through a convolution layer, a linear rectifying layer and a pooling layer; and in the residual attention network, a long-distance dependence relationship being established and an attention weight being generated for the dimensionality-reduced feature vector through multiple layers of self-attention modules, and finally predicted values of a plurality of target parameters being output based on the attention weight;

S3, performing dimensionality reduction screening on the structural parameters according to the attention weight finally obtained in S2 to obtain structural parameters to be optimized; for any biomass boiler economizer to be optimized, with weighting results of all the target parameters to be optimized as a multi-target optimization function, performing multi-target optimization on the structural parameters to be optimized in the economizers by adopting an iterative optimization algorithm, in an optimization process, outputting predicted values of all the target parameters to be optimized in each round of iteration according to a group of structural parameters to be optimized of the economizers by utilizing the heat exchanger target parameter prediction model, and after optimization is completed, obtaining optimal values of the structural parameters to be optimized in the economizers.

As preferred, the target parameters to be optimized include optimum heat exchange efficiency of the heat exchangers, flow pressure drop, ash deposition abrasion degree, weight and manufacturing cost.

As preferred, the multi-target optimization function is obtained from all the target parameters to be optimized according to weighted power multiplication, with a form of $$I(x) = \sum_{i=1}^{K} \lambda_i f_i(x)^{1/\lambda_i},$$

wherein K is the number of the target parameters to be optimized, x indicates all the structural parameters to be optimized in the economizers, $\lambda_i$ indicates a weight value of the ith target parameter to be optimized, $f_i(x)$ indicates the predicted value of the ith target parameter to be optimized output by the heat exchanger target parameter prediction model.

Further, in S2, the weighted loss of all the target parameters to be optimized is obtained from a single loss of all the target parameters to be optimized according to weighted power multiplication, with a form of $$L = \sum_{i=1}^{K} \lambda_i l_i^{1/\lambda_i},$$

wherein li indicates the single loss of the ith target parameter to be optimized.

As preferred, the iterative optimization algorithm is Bayesian optimization algorithm.

As preferred, in S3, when dimensionality reduction screening is performed on the structural parameters, a contribution rate of each structural parameter to the target parameters to be optimized is represented with the attention weight corresponding to the structural parameter, and a screened structural parameter with the contribution rate higher than a threshold value is selected as a structural parameter to be optimized.

As preferred, in S1, the heat exchangers for establishing the sample database include the economizers in a biomass boiler and other heat exchangers in a biomass boiler.

As preferred, in each sample of the sample database, a variable in a category form is encoded by adopting a manner of weight of evidence, and a variable in a numeric form is subjected to normalization processing.

As preferred, the residual attention network has two layers of self-attention modules, and each layer of self-attention module solves gradient vanishing by adopting residual learning.

As preferred, for all the biomass boiler economizers subjected to multi-target optimization, the optimal values of the structural parameters to be optimized in the different economizers obtained through optimization are added into a heat exchanger optimization database as recommended model selection parameters for direct query and selection for users.

Compared with the prior technology, the present invention has the following beneficial effects:

1. Based on the CNN+the self-attention mechanism, the present invention establishes a residual self-attention convolution optimization model, the CNN effectively extracts multi-scale features, the attention mechanism effectively extracts the complex dependence relationship, residual learning solves the problem of gradient descent, an objective function is better fit, and optimization objective modeling accuracy is improved. Compared with traditional optimization for all variables of a biomass boiler economizer, the self-attention mechanism can automatically focus on features with high importance, so as to better optimize variables with high importance, making the subsequent optimization and adjustment convenient and quick, and greatly reducing the optimization cost.

2. The present invention is applied to the field of design optimization of a high-performance biomass boiler economizer structure, which can overcome the defect of less historical data of such economizer, and different from a traditional optimization method based on artificial experience, the present invention adopts parameter optimization methods such as Bayesian optimization, which can effectively solve the problem of small sample optimization under big data and obtain the better optimization result with less data.

3. The present invention only needs to obtain the heat exchanger target parameter prediction model through off-line training optimization, and by saving attention weights of different input features, after entering an optimization flow of an actual newly-built heat exchanger model subsequently, independent variable weights are directly extracted from an off-line database without retraining, which is conducive to the rapid optimization of the new structure heat exchanger.

4. According to the heat exchanger optimization law, the present invention establishes a weighted power multiplication multi-target optimization evaluation method for specific working conditions of the biomass boiler economizers, which can not only optimize the heat exchange efficiency, but also comprehensively consider the comprehensive effects of piezoresistance, ash deposition abrasion and cost, so the proportion of main optimization conditions is increased, secondary optimization conditions are ignored, and the applicability is wider.

5. The present invention establishes a big data model selection library for the biomass boiler heat exchangers, which can improve the speed and convenience of optimization, give real-time data for optimization, and adapt to continuous optimization under different service lives and working conditions.

DETAILED DESCRIPTION OF THE EMBODIMENTS

In order to make the above objects, characteristics and advantages of the present invention more obvious and understandable, the detailed description of the present invention will be described in detail below in combination with the accompanying drawings. Many specific details are set forth in the following description to facilitate full understanding of the present invention. However, the present invention can be implemented in many other ways different from those described here, and those skilled in the art can make similar improvements without violating the connotation of the present invention. Therefore, the present invention is not limited by the specific embodiments disclosed below. The technical features in each embodiment of the present invention can be combined accordingly without any conflict.

Economizer is a heat exchanger installed on the lower part of a flue at the tail of a boiler to recover waste heat of exhaust gas and is a heating surface that heats boiler feed water into saturated water under drum pressure. Because the economizer absorbs heat of high-temperature flue gas, the exhaust gas temperature of the flue gas can be lowered, boiler energy is saved, and the efficiency is improved. In a biomass boiler, different manufacturers often have different emphasis on boiler performance, so different manufacturers usually need to install different types of economizers and perform optimization design on their structural parameters according to their own product design needs to meet their requirements for boiler performance.

Figure 1:
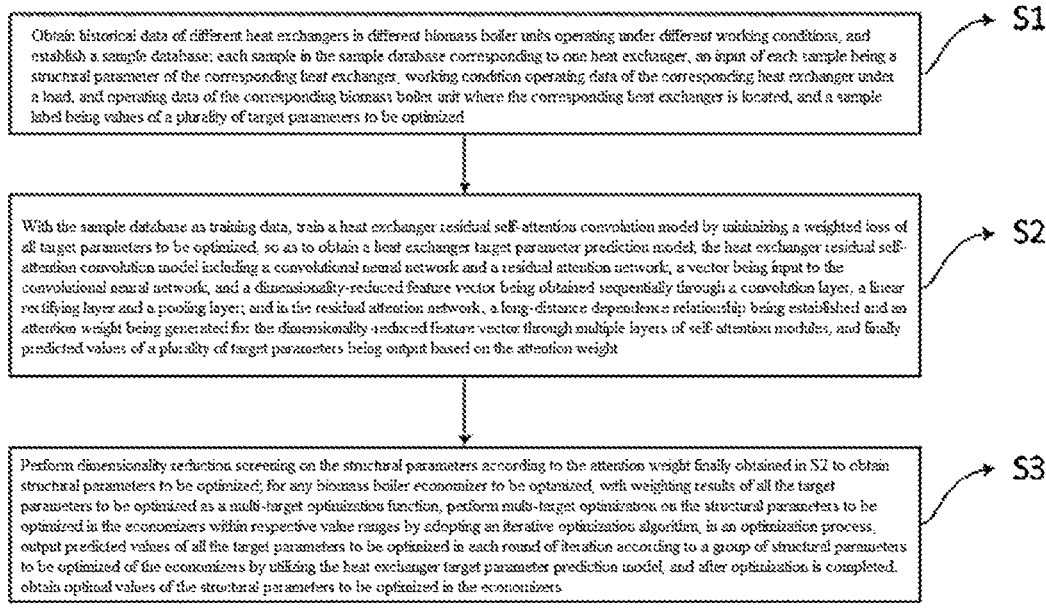
FIG. 1 is a step flow diagram of an optimization design method for structural parameters of biomass boiler economizers.

Referring to FIG. 1, in an exemplary embodiment of the present invention, an optimization design method for structural parameters of biomass boiler economizers is provided, its basic flow steps including:

S1, historical data of different heat exchangers in different biomass boiler units operating under different working conditions are obtained, and a sample database is established. The sample database is composed of a great number of samples obtained after the historical data are processed. Each sample corresponds to one heat exchanger and is used as a training sample for a network model subsequently to perform supervised learning on the network model, thereby containing an input part and a label part. An input of the sample is a structural parameter of the heat exchanger, working condition operating data of the heat exchanger under a load, and operating data of the biomass boiler unit where the heat exchanger is located, and a sample label is values of a plurality of target parameters to be optimized.

It should be noted first that limited by various objective conditions, relevant historical data of the economizers in the biomass boiler units always have the problem of too few samples, other different heat exchangers also exist in the biomass boiler units except the economizers, and when operating in the biomass boiler units, these heat exchangers are similar to the economizers in heat exchange mechanism. Therefore, in step S1, relevant data of the different heat exchangers in the different biomass boiler units are all used as sample data to establish the samples, that is, in S1, the heat exchangers for establishing the sample database include the economizers in a biomass boiler and other heat exchangers.

The target parameters to be optimized refer to performance indexes of the biomass boiler, and since different manufacturers always have different focuses in performance index, to make the method more universal, the present invention needs to incorporate various different performance parameters for multi-target optimization. The specific types and number of the target parameters to be optimized need to cover possibly focused performance indexes of different manufacturers as much as possible. As an implementation of the present invention, the target parameters to be optimized may be set as a combination of parameters including the optimum heat exchange efficiency of the heat exchangers, flow pressure drop, ash deposition abrasion degree, weight and manufacturing cost, and focuses of different manufacturers on performance may be embodied by weight values set in a subsequent multi-target optimization process.

The structural parameters of the heat exchangers refer to a set of own structural parameters of each heat exchanger, which should contain all parameters that may affect any target parameter to be optimized of the heat exchanger as much as possible, such as material parameter, size parameter, shape parameter, etc. of the heat exchanger, which may be specifically selected according to experts' experience or actual testing. The material parameter may be information such as material type, density, heat exchange performance, etc. of the heat exchanger, the size parameter may be information such as transverse-longitudinal diameter ratio, welding spot diameter, expansion height, etc. of a heat exchanger model, and the shape parameter may be information such as surface curvature, etc. of the heat exchanger.

The working condition operating data of the heat exchanger under the load refer to an operating index data sequence measured when the heat exchanger operates at a working condition under a specified load, wherein a specific operating index needs to be determined according to an on-site monitoring index and should cover key indexes that can be used to optimize the structural parameters of the heat exchanger as much as possible. Since the load under which each heat exchanger operates is not fixed, working condition operating data of one heat exchanger are possibly obtained under a different load, however, the working condition operating data of one heat exchanger under different loads will be processed into different samples. For a single sample, the load of the heat exchanger is fixed.

The operating data of the biomass boiler unit where the heat exchanger is located refer to an operating index data sequence measured when the heat exchanger operates within a specified biomass boiler unit, wherein a specific operating index needs to be determined according to an on-site monitoring index and should cover key indexes that can be used to optimize the structural parameters of the heat exchanger as much as possible. Since each heat exchanger is possibly installed in different biomass boiler units to operate, the biomass boiler unit corresponding to the heat exchanger is not fixed. Therefore, operating data of one heat exchanger are possibly obtained in different biomass boiler units, however, the operating data of one heat exchanger in different biomass boiler units will be processed into different samples. For a single sample, the biomass boiler unit where the heat exchanger is located is fixed.

It can be seen that although each sample corresponds to one heat exchanger, since one heat exchanger is possibly used in different biomass boiler units or used under different load working conditions, it is still possible that a plurality of different samples correspond to the same heat exchanger. However, for different samples, at least one of their information such as heat exchanger types, structural parameters, loads of heat exchangers and biomass boiler units where the heat exchangers are located is different.

The sample database can be used to train a network model after being established, so that the network model can accurately output a label corresponding to each sample based on an input of the sample. The training process and the adopted network model are described in detail below according to S2.

S2, with the sample database established in S1 as training data, a heat exchanger residual self-attention convolution model is trained by minimizing a weighted loss of all the target parameters to be optimized, and the trained heat exchanger residual self-attention convolution model can be used as a heat exchanger target parameter prediction model which is used to predict values of the plurality of target parameters to be optimized according to input parameter information.

In the present invention, the adopted heat exchanger residual self-attention convolution model contains a convolutional neural network and a residual attention network, and it needs to contain an input layer and an output layer for the neural network. An input of the convolutional neural network is multi-dimensional data in the form of an array, and the array may be one-dimensional or two-dimensional. The structural parameter of the heat exchanger, the working condition operating data of the heat exchanger under the load, and the operating data of the biomass boiler unit where the heat exchanger is located in the above sample all need to be converted through preprocessing into vectors capable of being input to the network. Since input parameters of the sample in the sample database contain both variable data in a category form and variable data in a numeric form, the two types of variable data need to be subjected to different preprocessing methods respectively, variables in the category form need to be encoded, while variables in the numeric form need to be subjected to normalization processing. As an implementation of the present invention, the variables in the category form may be encoded by adopting a manner of weight of evidence (WOE), and the variables in the numeric form is subjected to normalization by adopting a min-max standardized method.

The convolutional neural network (CNN) is a feedforward neural network that contains convolution calculation and has a deep structure. In the present invention, an internal structure of the convolutional neural network contains a convolution layer, a linear rectifying layer (Relu) and a pooling layer, and after an input vector sequentially passes through the convolution layer, the linear rectifying layer and the pooling layer, a dimensionality-reduced feature vector is obtained. The convolution layer is mainly used to extract a local feature from the input vector, the linear rectifying layer (Relu) is right behind the convolution layer and is used to activate the local feature through a ReLU function, and then the pooling layer is used to compress and reduce the dimensionality of the input feature, so that the network calculation complexity is lowered, and a main feature of input data of the heat exchanger is extracted.

The residual attention network is connected behind the convolutional neural network, and the dimensionality-reduced feature vector output from the convolutional neural network is input to the residual attention network. The residual attention network contains multiple layers of self-attention modules, an input long-distance dependence relationship is established and an attention weight is generated for the dimensionality-reduced feature vector through the multiple layers of self-attention modules, and finally predicted values of a plurality of target parameters are output based on the attention weight.

The multiple layers of self-attention modules allocate focusing points for different features based on a self-attention mechanism, as for the feature vector output from the pooling layer, through the self-attention modules, the long-distance dependence relationship between input sequences may be established and weights of different connections are dynamically generated, the higher the weight, the larger the influence of the corresponding feature on an output, and thus attention may be paid to key features. It should be noted that in the network, the problem of gradient descent, i.e. gradient vanishing, is solved through residual learning in each layer of self-attention module. The number of layers of the self-attention modules in the residual attention network may be adjusted according to the actual condition, and preferably two layers of self-attention modules are adopted.

In addition, after the attention weight is obtained, the predicted values of the plurality of target parameters may be output based on the attention weight. Specifically, in the self-attention modules, a query-key-value (Q-K-V) mode may be adopted, the input vector is calculated to obtain a self-attention output, and this step belongs to the prior art of such network, which will not be repeated.

It can be seen that in the established heat exchanger residual self-attention convolution model, for the input of any sample, the plurality of target parameters may be predicted through a convolution kernel self-attention mechanism, and its prediction accuracy needs to be improved by continuous parameter optimization through the training data. The heat exchanger residual self-attention convolution model may be trained through a conventional training method, and the key is to set a corresponding loss function so as to optimize network model parameters by minimizing the loss function through a gradient descent method and the like.

In the present invention, since all the target parameters to be optimized need to be subjected to multi-target optimization subsequently, the loss function adopted in the training process of the heat exchanger residual self-attention convolution model should also contain all the target parameters to be optimized, that is, a weighted loss of all the target parameters to be optimized is adopted as a total loss. The total loss is formed by weighting a respective single loss of the target parameters to be optimized, and a specific weighting manner may be adjusted according to actual needs. A respective single loss weight of the different target parameters to be optimized in the total loss actually also reflects importance of the different target parameters to be optimized, and may be adjusted according to the focus points of manufacturers on heat exchange performance indexes of the economizers.

As an implementation of the present invention, a plurality of targets are weighted in the multi-target optimization process through weighted power multiplication. Specifically, the weighted loss L of the target parameters to be optimized is obtained from the single loss of all the target parameters to be optimized according to the weighted power multiplication, with a form of:

$$L = \sum_{i=1}^{K} \lambda_i l_i^{1/\lambda_i}$$

K is the number of the target parameters to be optimized, $\lambda_i$ indicates a weight value of the ith target parameter to be optimized, $l_i$ indicates a single loss of the ith target parameter to be optimized. The single loss of each target parameter to be optimized may be obtained from the predicted value and a truth value of the parameter.

S3, dimensionality reduction screening is performed on the structural parameters according to the attention weight finally obtained in S2 to obtain structural parameters to be optimized. After the aforementioned heat exchanger residual self-attention convolution model is trained, an attention weight matrix will be obtained, weights between all the input feature parameters can be found in the matrix for each structural parameter to be optimized, and the weights actually reflect the influence degree of each input feature parameter on the structural parameters to be optimized, namely a contribution rate. Therefore, when dimensionality reduction screening is performed on the structural parameters, the contribution rate of each structural parameter to the target parameters to be optimized is represented with the attention weight corresponding to the structural parameter, and a screened structural parameter with the contribution rate higher than a threshold value is selected as the structural parameter to be optimized. A specific contribution rate threshold value may be adjusted according to actual needs, a total contribution rate total threshold value may also be set for all the structural parameters, and structural parameters with a total contribution rate not lower than the total threshold value are selected. It should be noted that although each sample in S1 contains various feature parameters, when parameters are screened in this step, only the structural parameters therein are considered, and when which structural parameters are selected to be the structural parameters to be optimized, not only are their contribution rates considered, but also structural parameters not allowed to be optimized and adjusted in the economizers are removed according to actual conditions.

For any heat exchanger that is about to be used as the biomass boiler economizer, a multi-target optimization function may be established according to the focus points of the manufacturers on performance indexes, and then the structural parameters to be optimized determined above are optimized, a specific optimization process is as follows: for the biomass boiler economizer to be optimized (the economizer is also a heat exchanger), with weighting results of all the target parameters to be optimized as a multi-target optimization function, multi-target optimization is performed on the structural parameters to be optimized in the economizer within respective value ranges by adopting an iterative optimization algorithm, in the optimization process, the predicted values of all the target parameters to be optimized are output in each round of iteration according to a group of structural parameters to be optimized of the economizer by utilizing the heat exchanger target parameter prediction model, and then a multi-target optimization function value is calculated according to the predicted values of all the target parameters to be optimized. Finally, after optimization is completed through continuous iteration, an optimal value of all the structural parameters to be optimized in the economizer is obtained.

Similarly, a weighting manner of the target parameters to be optimized in the multi-target optimization function may be adjusted according to actual needs. The weights of the different target parameters to be optimized in the multi-target optimization function actually also reflect importance of the different target parameters to be optimized and may be adjusted according to the focus points of the manufacturers on heat exchange performance indexes of the economizers. Since the total loss function adopted for training the aforementioned model also considers the importance of the different target parameters to be optimized, it is better that the multi-target optimization function here also adopts the same weight setting as the total loss function. As a specific implementation of the present invention, the multi-target optimization function is also obtained from all the target parameters to be optimized according to the weighted power multiplication, with a form of:

$$I(x) = \sum_{i=1}^{K} \lambda_i f_i(x)^{1/\lambda_i}$$

K is the number of the target parameters to be optimized, x indicates all the structural parameters to be optimized in the economizer, $\lambda_i$ indicates a weight value of the ith target parameter to be optimized, $f_i(x)$ indicates the predicted value of the ith target parameter to be optimized output by the aforementioned trained heat exchanger target parameter prediction model.

In order to guarantee that the model is more applicable to the multi-target optimization process, it is preferred that a weight value $\lambda_i$ of each target parameter to be optimized in the total loss function of the model and the multi-target optimization function is kept consistent.

In the present invention, any feasible parameter optimization method may be selected as the iterative optimization algorithm according to actual needs, such as a genetic algorithm, a multi-target chaotic particle swarm optimization algorithm and a Bayesian optimization algorithm, and the Bayesian optimization algorithm is preferred, which can effectively solve the problem of small sample optimization under big data and can obtain the better optimization result with less data.

In addition, it should be noted that although only part of the structural parameters are selected as the structural parameters to be optimized in the present invention, in the iterative optimization process, in each round of iteration, besides inputting these structural parameters to be optimized, other structural parameters of the economizer, the working condition operating data of the economizer under a load and the operating data of the biomass boiler unit where the economizer is located also need to be input into the heat exchanger target parameter prediction model together to obtain the predicted values of the target parameters to be optimized. However, the working condition operating data, corresponding to the data input at the moment, of the economizer under the load should be set as working condition operating data of the economizer under a designed load when the economizer is actually put into operation, the operating data, corresponding to the input data, of the biomass boiler unit where the economizer is located should be set as designed operating data of the biomass boiler unit when the economizer is actually put into operation subsequently, and these data can be determined from design information of the biomass boiler unit.

In addition, to facilitate subsequent query, for all the biomass boiler economizers that have been subjected to multi-target optimization in aforementioned step S3, the optimal value of the structural parameters to be optimized in each economizer obtained through optimization may be used as a recommended model selection parameter to be added into a model selection database, and each group of recommended model selection parameters is associated with their corresponding design loads, biomass boiler units and other information. When a user encounters design requirements of similar economizers subsequently, the model selection database may be directly inquired for selection. When economizers that are not in the model selection database occur, multi-target optimization may be performed again through an incremental learning manner, and an optimal value of structural parameters to be optimized in each economizer obtained through optimization is also added into the model selection database as a recommended model selection parameter.

Therefore, the present invention can achieve quick prediction of the multiple target parameters through the neural network established based on big data samples, such that the time for structural optimization design of a high-performance biomass boiler economizer is greatly shortened. By establishing a big data model selection database for the heat exchangers of the biomass boilers, quick query and selection for a user are further facilitated. Overall, the present invention can improve the optimization precision, give real-time data for optimization, and adapt to continuous optimization under different service lives and working conditions of the economizers in the biomass boiler units.

To further show the advantages that the optimization design method for the structural parameters of the biomass boiler economizers of the present invention can achieve, the method is combined to a specific instance below to show the technical effects.

EMBODIMENT

In the present embodiment, a pillow plate heat exchanger is about to be used as a biomass boiler economizer, structural parameters of the heat exchanger are subjected to optimization design based on an optimization design method for structural parameters of biomass boiler economizers in aforementioned S1-S3, and a specific implementing process is described in detail below.

As shown in FIG. 1, the present invention provides an intelligent optimization method for economizer structural parameters applied to a biomass boiler, and the technical solution adopted by the present invention includes the following steps:

Step 1, a sample database for operating of heat exchangers is established: obtaining historical data of different heat exchangers in different biomass boiler units operating under different working conditions, and establishing the sample database; wherein each sample in the sample database corresponds to one heat exchanger, an input of each sample is a structural parameter of the corresponding heat exchanger, working condition operating data of the corresponding heat exchanger under a load, and operating data of the corresponding biomass boiler unit where the corresponding heat exchanger is located, and a sample label is values of a plurality of target parameters to be optimized.

In the present embodiment, the structural parameters of the heat exchangers are obtained from a three-dimensional model, for historical working condition operating data and historical operating data of the different units, the data need to be preprocessed to form samples, and preprocessing includes encoding category data and performing normalization processing on numeric data. For category features, such as heat exchanger types, power plants to which the heat exchangers belong and specific application devices, a WOE manner is adopted for encoding. WOE is a supervised encoding manner and can use an attribute of predicting a concentration ratio of a category as a numeric advantage for encoding, thereby better dealing with the problem of the concentration ratio of a plurality of category features of the heat exchangers. Numeric data, such as primary air temperature, superheater water inlet temperature and heat exchanger size, are processed by adopting a min-max standardized normalization method, original data are subjected to linear transformation, and thus results are mapped to 0-1, avoiding excessive differences between different data. At the same time, a training label is added to each sample, and the optimum heat exchange efficiency, flow pressure drop, ash deposition abrasion degree, weight and manufacturing cost are obtained as multiple label values according to different historical working conditions of different heat exchangers and the operating data of different units.

Step 2, a heat exchanger target parameter prediction model is established: with the sample database obtained in the last step as training data, a heat exchanger residual self-attention convolution model is trained by minimizing a weighted loss of all the target parameters to be optimized, to obtain the heat exchanger target parameter prediction model. The heat exchanger residual self-attention convolution model includes a convolutional neural network and a residual attention network, a vector is input to the convolutional neural network, and a dimensionality-reduced feature vector is obtained sequentially through a convolution layer, a linear rectifying layer and a pooling layer; and in the residual attention network, a long-distance dependence relationship is established and an attention weight is generated for the dimensionality-reduced feature vector through multiple layers of self-attention modules, and finally predicted values of the plurality of target parameters are output based on the attention weight.

Figure 2:
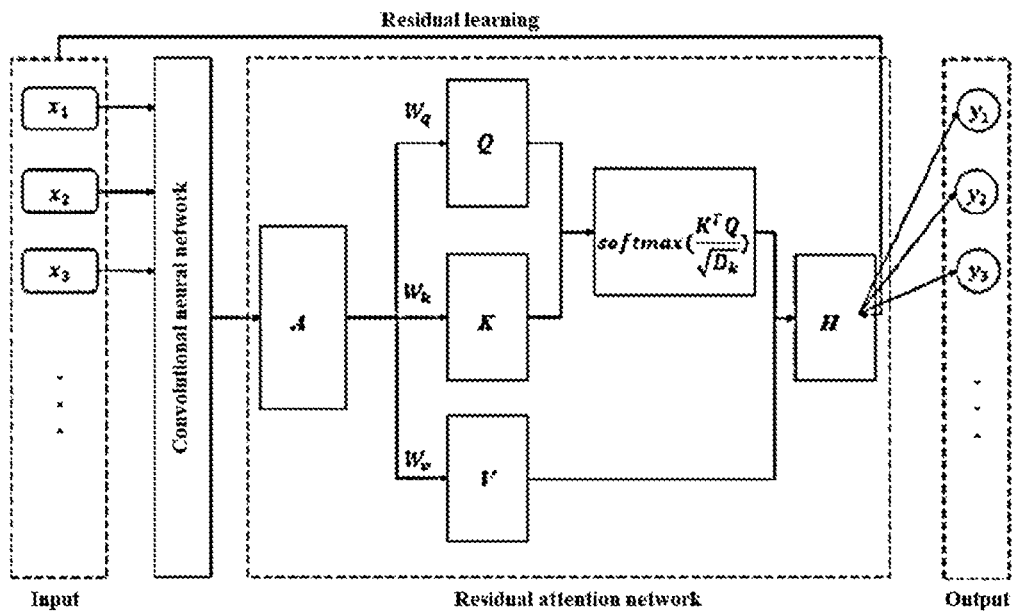
FIG. 2 is a schematic structural diagram of a heat exchanger residual self-attention convolution model.

In the present embodiment, to facilitate understanding, a specific data processing flow in the heat exchanger residual self-attention convolution model is described. As shown in FIG. 2, the heat exchanger residual self-attention convolution model includes the convolutional neural network and the residual attention network, x1, x2 and x3 all indicate features input to the model, y1, y2 and y3 all indicate target parameters output by the model. First, physical property parameter samples of the heat exchanger at different moments obtained by normalization encoding of the heat exchanger database obtained from step 1 may be represented as $$X = \begin{bmatrix} x_{11} & \cdots & x_{1m} \\ \vdots & \ddots & \vdots \\ x_{n1} & \cdots & x_{nm} \end{bmatrix},$$

wherein a row vector xim indicates data under different time sequences, and a column vector xin indicates input data in different dimensions, such as a heat exchanger type, the number of a power plant to which the heat exchanger belongs, and a heat exchanger size. X is used as an input of the convolutional neural network in the heat exchanger residual self-attention convolution model, and a matrix output through a convolution layer, a linear rectifying layer and a pooling layer sequentially is $$A = \begin{bmatrix} a_{11} & \cdots & a_{1m} \\ \vdots & \ddots & \vdots \\ a_{n1} & \cdots & a_{nm} \end{bmatrix};$$

the residual attention network contains two layers of self-attention modules, a query-key-value (Q-K-V) mode is adopted, and a self-attention output of an input sequence is $$H = V \operatorname{softmax}\left(\frac{K^T Q}{\sqrt{D_k}}\right),$$

wherein: Q=A·Wq; K=A·Wk; and V=A·Wv Wq, Wk, and Wv are three weight matrices respectively, and Dk is a length of a key vector matrix K. Specifically, in the residual attention network, through residual learning of the self-attention modules, the vector $$Q' = Q + \begin{bmatrix} x_{11} & \cdots & x_{1m} \\ \vdots & \ddots & \vdots \\ x_{n1} & \cdots & x_{nm} \end{bmatrix}$$

is obtained, and similarly, a vector K' and a vector V' are obtained to form a residual self-attention output. Finally, the residual self-attention output and an initial feature X are added to obtain an output=X+Attention (Q', K', V'). The model adopts two layers of residual self-attention convolutional neural networks, and the convolution layer uses a 3×3 filter, with a step length S=1. Thus, as described above, the self-attention modules adopt the query-key-value mode, for an input sequence X, a vector sequence $$H = V \operatorname{softmax}\left(\frac{K^T Q}{\sqrt{D_k}}\right)$$

is output, and Q, K and V are a query vector matrix, a key vector matrix and a value vector matrix respectively, which are obtained through linear mapping of the input sequence X In the present instance, a total loss function used by model training and the aforementioned adopt a weighted loss L established through weighted power multiplication.

Step 3, multi-target optimization is performed on the biomass boiler economizer: performing dimensionality reduction screening on the structural parameters according to the attention weight finally obtained in the last step to obtain structural parameters to be optimized. For the economizer in the form of the pillow plate heat exchanger to be optimized, with weighting results of all the target parameters to be optimized as a multi-target optimization function, multi-target optimization is performed on the structural parameters to be optimized in the economizer by adopting an iterative optimization algorithm, and in an optimization process, predicted values of all the target parameters to be optimized are output in each round of iteration according to a group of structural parameters to be optimized of the economizer by utilizing the heat exchanger target parameter prediction model; and after optimization is completed, optimal values of the structural parameters to be optimized in the economizer are obtained.

In the present embodiment, a surface convective heat transfer coefficient h and flow pressure drop (denoted by unit pressure drop) are selected as two target parameters to be optimized, and optimization independent variables finally obtained for a pillow unit according to the attention weight are a spot size dSP, a horizontal-longitudinal diameter ratio sT/sL and a maximum internal expansion height $\delta i$ respectively. As described above, the multi-target optimization function I(x) is established by adopting weighted power multiplication, and a weight is consistent with that in the total loss function. In the present embodiment, a weight $\lambda 1$ of the convective heat transfer coefficient is 0.7, and a weight $\lambda 2$ of the unit pressure drop is −0.3.

Finally, parameters of the economizer obtained through the method of the present invention are as shown in Table 1.

Table 1: Optimization effects of heat exchanger obtained through method of the present invention

| Parameter | Optimization independent variable | | | Optimization target | |
|---|---|---|---|---|---|
| | Spot size $d_{SP}$ | Horizontal-longitudinal diameter ratio $S_T/S_L$ | Maximum internal expansion height $\delta_i$ | Heat exchange efficiency (W/m² · K) | Unit pressure drop (kPa/m) |
| Before optimization | 10.0 | 1.16 | 3.0 | 7000 | 22 |
| After optimization | 4.0 | 2.8 | 10.0 | 12000 | 15 |

The heat exchange efficiency h represents the heat exchange ability of the heat exchanger, and the larger the value, the better the effect; and the unit pressure drop represents lost pressure of fluid in the heat exchanger flowing through a unit length, and the smaller the value, the smaller the pressure loss. It can be seen from Table 1 that, before optimization, the heat transfer efficiency is 7000 (W/m2K), and the pressure drop is 22 (kPa/m). In the method of the present invention, important variables can be extracted according to the self-attention model, the number of the variables is reduced to 3, and after optimization, the heat transfer efficiency is increased by 71.4%, and the unit pressure drop is reduced by 31.8%.

An actual experiment process is further used for testing, normal-temperature water is transported to a heat exchanger testing channel through a constant-temperature water pump, hot air is produced via an electric gas heater through a wind tunnel, hot fluid is air, tin=100° C., allowed pressure drop $\Delta P=40$ kPa, and a flow rate Gm=40 kg/s; cold fluid is water, tin=20° C., allowed pressure drop $\Delta P=35$ kPa, and a flow rate Gm=30 kg/s. The hot fluid air with the high flow rate is led to an external channel of the heat exchanger, and the cold fluid water is led to an internal channel of the heat exchanger. The outlet temperatures of the cold fluid and the hot fluid are measured by a temperature sensor respectively, and the outlet pressure of the cold fluid and the hot fluid is measured by a pressure sensor, to verify whether the heat transfer efficiency and unit pressure drop of the heat exchanger are optimized. The results show that the method of the present invention has a good effect on the optimization of the structural parameters of the economizer of the biomass boiler.

In addition, it should be noted that in the aforementioned embodiments of the present invention, each step of S1-S3 can be implemented by means of a software program unit. However, it should be understood that the step division described above is only a schematic logical function division, and there can be another division method in actual implementation. For example, multiple steps can be combined or integrated, or can be split into different steps, and then the corresponding functions can be realized through different software program units.

Therefore, if a software program unit is used to implement the steps in the above method, it can be sold or used as an independent product, that is, stored in a computer-readable storage medium. Based on this understanding, the technical solution of the present invention may be embodied in the form of a software product essentially or on the part of contributions to the prior art or all or part of the technical solution. The computer software product is stored in a storage medium and includes a plurality of instructions configured to enable a computer device (a personal computer, or a server or a network device, etc.) to execute all or part of the steps of the method of all the embodiments of the present invention. The aforementioned storage media include: a USB flash disk, a mobile hard disk, a read-only memory (ROM), a random-access memory (RAM), a magnetic disk or an optical disk and other media that can store program codes.

The above embodiments are only preferred solutions of the present invention, but they are not intended to limit the present invention. Those of ordinary skill in the art can also make various changes and modifications without departing from the spirit and scope of the present invention. Therefore, any technical solution obtained by equivalent replacement or equivalent transformation falls within the protection scope of the present invention.

What is claimed is:

1. An optimization design method for structural parameters of biomass boiler economizers, comprising:
    S1, obtaining historical data of different heat exchangers in different biomass boiler units operating under different working conditions, and establishing a sample database, each sample in the sample database corresponding to one heat exchanger, an input of each sample being a structural parameter of the corresponding heat exchanger, working condition operating data of the corresponding heat exchanger under a load, and operating data of a corresponding biomass boiler unit where the corresponding heat exchanger is located, and a sample label being values of a plurality of target parameters to be optimized;
    S2, with the sample database as training data, training a heat exchanger residual self-attention convolution model by minimizing a weighted loss of all the target parameters to be optimized, so as to obtain a heat exchanger target parameter prediction model, the heat exchanger residual self-attention convolution model comprising a convolutional neural network and a residual attention network, a vector input to the convolutional neural network, and a dimensionality-reduced feature vector obtained sequentially through a convolution layer, a linear rectifying layer and a pooling layer, and in the residual attention network, a long-distance dependence relationship established and an attention weight generated for the dimensionality-reduced feature vector through multiple layers of self-attention modules, and finally predicted values of a plurality of target parameters output based on the attention weight;

S3, performing dimensionality reduction screening on the structural parameters according to the attention weight finally obtained in S2, representing a contribution rate of each structural parameter to the target parameters to be optimized with the attention weight corresponding to the structural parameter, and selecting a screened structural parameter with the contribution rate higher than a threshold value as a structural parameter to be optimized, for any biomass boiler economizer to be optimized, with weighting results of all the target parameters to be optimized as a multi-target optimization function, performing multi-target optimization on the structural parameters to be optimized in the economizers within respective value ranges by adopting an iterative optimization algorithm, in an optimization process, outputting predicted values of all the target parameters to be optimized in each round of iteration according to a group of structural parameters to be optimized of the economizers by utilizing the heat exchanger target parameter prediction model, and then calculating a multi-target optimization function value according to the predicted values of all the target parameters to be optimized, and after optimization is completed, obtaining optimal values of the structural parameters to be optimized in the economizers.

2. The optimization design method for the structural parameters of the biomass boiler economizers according to claim 1, wherein the target parameters to be optimized comprise optimum heat exchange efficiency of the heat exchangers, flow pressure drop, an ash deposition abrasion degree, a weight and a manufacturing cost.

3. The optimization design method for the structural parameters of the biomass boiler economizers according to claim 1, wherein the multi-target optimization function is obtained from all the target parameters to be optimized according to weighted power multiplication, with a form of $$I(x) = \sum_{i=1}^{K} \lambda_i f_i(x)^{1/\lambda_i},$$

wherein K is the number of the target parameters to be optimized, x indicates all the structural parameters to be optimized in the economizers, $\lambda_i$ indicates a weight value of an ith target parameter to be optimized, $f_i(x)$ indicates the predicted value of the ith target parameter to be optimized output by the heat exchanger target parameter prediction model.

4. The optimization design method for the structural parameters of the biomass boiler economizers according to claim 3, wherein in S2, the weighted loss of all the target parameters to be optimized is obtained from a single loss of all the target parameters to be optimized according to weighted power multiplication, with a form of $$L = \sum_{i=1}^{K} \lambda_i l_i^{1/\lambda_i},$$

wherein $l_i$ indicates the single loss of the ith target parameter to be optimized.

5. The optimization design method for the structural parameters of the biomass boiler economizers according to claim 1, wherein the iterative optimization algorithm is a Bayesian optimization algorithm.

6. The optimization design method for the structural parameters of the biomass boiler economizers according to claim 1, wherein in S1, the heat exchangers for establishing the sample database comprise the economizers in a biomass boiler and other heat exchangers than the economizers.

7. The optimization design method for the structural parameters of the biomass boiler economizers according to claim 1, wherein, in each sample of the sample database, a variable in a category form is encoded by adopting a manner of weight of evidence, and a variable in a numeric form is subjected to normalization processing.

8. The optimization design method for the structural parameters of the biomass boiler economizers according to claim 1, wherein the residual attention network has two layers of self-attention modules, and each layer of self-attention module solves gradient vanishing by adopting residual learning.

9. The optimization design method for the structural parameters of the biomass boiler economizers according to claim 1, wherein, for all the biomass boiler economizers subjected to multi-target optimization, the optimal values of the structural parameters to be optimized in different economizers obtained through optimization are added into a model selection database as recommended model selection parameters for direct query and selection for users.

* * * * *